United States Patent
Manipatruni et al.

(10) Patent No.: US 9,460,768 B2
(45) Date of Patent: Oct. 4, 2016

(54) CROSS POINT ARRAY MRAM HAVING SPIN HALL MTJ DEVICES

(71) Applicants: Sasikanth Manipatruni, Hillsboro, OR (US); Dmitri E. Nikonov, Beaverton, OR (US); Ian A. Young, Portland, OR (US)

(72) Inventors: Sasikanth Manipatruni, Hillsboro, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,050

(22) PCT Filed: Mar. 14, 2013

(86) PCT No.: PCT/US2013/031699
§ 371 (c)(1),
(2) Date: Jun. 21, 2013

(87) PCT Pub. No.: WO2014/142922
PCT Pub. Date: Sep. 18, 2014

(65) Prior Publication Data
US 2014/0269035 A1     Sep. 18, 2014

(51) Int. Cl.
G11C 11/16 (2006.01)
H01L 43/02 (2006.01)
H01L 43/08 (2006.01)
H01L 27/22 (2006.01)
G11C 11/18 (2006.01)

(52) U.S. Cl.
CPC ............ G11C 11/1675 (2013.01); G11C 11/18 (2013.01); H01L 27/222 (2013.01); H01L 43/02 (2013.01); H01L 43/08 (2013.01)

(58) Field of Classification Search
None
See application file for complete search history.

(56) References Cited

U.S. PATENT DOCUMENTS

| | | | | |
|---|---|---|---|---|
| 6,515,897 | B1 * | 2/2003 | Monsma | G11C 11/15 365/145 |
| 8,295,006 | B2 * | 10/2012 | Sugano et al. | 360/112 |
| 8,889,433 | B2 * | 11/2014 | De Brosse et al. | 438/3 |
| 8,963,222 | B2 * | 2/2015 | Guo | 257/295 |
| 8,988,109 | B2 * | 3/2015 | Manipatruni et al. | 326/101 |
| 2005/0232001 | A1 * | 10/2005 | Tsuji | G11C 11/16 365/158 |
| 2007/0176251 | A1 * | 8/2007 | Oh | B82Y 25/00 257/421 |

(Continued)

FOREIGN PATENT DOCUMENTS

EP       1706751    2/2008
WO   WO-2013-025994    2/2013

OTHER PUBLICATIONS

International Search Report and Written Opinion of the International Searching Authority dated Dec. 13, 2013, in International Patent Application No. PCT/US2013/031699.

(Continued)

*Primary Examiner* — Kevin Bernatz
(74) *Attorney, Agent, or Firm* — Blakely, Sokoloff, Taylor & Zafman LLP

(57) ABSTRACT

Cross point array magnetoresistive random access memory (MRAM) implementing spin hall magnetic tunnel junction (MTJ)-based devices and methods of operation of such arrays are described. For example, a bit cell for a non-volatile memory includes a magnetic tunnel junction (MTJ) stack disposed above a substrate and having a free magnetic layer disposed above a dielectric layer disposed above a fixed magnetic layer. The bit cell also includes a spin hall metal electrode disposed above the free magnetic layer of the MTJ stack.

8 Claims, 17 Drawing Sheets

(56) References Cited

U.S. PATENT DOCUMENTS

| | | |
|---|---|---|
| 2009/0168493 A1 | 7/2009 | Kim et al. |
| 2011/0273930 A1* | 11/2011 | Chang ................ G11C 13/0002 365/175 |
| 2012/0327714 A1* | 12/2012 | Lue .......................... G11C 5/02 365/185.17 |
| 2013/0005052 A1 | 1/2013 | Hu et al. |
| 2013/0015542 A1 | 1/2013 | Wang et al. |
| 2013/0043471 A1* | 2/2013 | Cao et al. ....................... 257/53 |
| 2014/0056060 A1* | 2/2014 | Khvalkovskiy et al. ..... 365/158 |
| 2014/0169088 A1* | 6/2014 | Buhrman et al. ............. 365/158 |
| 2014/0252439 A1* | 9/2014 | Guo ............................... 257/295 |
| 2014/0264513 A1* | 9/2014 | De Brosse et al. ........... 257/295 |
| 2014/0269036 A1* | 9/2014 | Pi et al. ......................... 365/158 |

OTHER PUBLICATIONS

International Preliminary Report on Patentability in International Patent Application No. PCT/US2013/031699 mailed Sep. 24, 2015, 7 pgs.

* cited by examiner

Cut Perpendicular to magnet
(a)

Cut Parallel to magnet
(b)

| Device | Resistivity (ρ) | Spin Hall Angle (to CoFeB) θ$_{SHE}$ | Gilbert Damping (α) |
|---|---|---|---|
| Pt-SHE | 20 μΩ.cm | 0.07 | 0.025 |
| Ta-SHE | 190 μΩ.cm | -0.15 | 0.008 |
| W-SHE | 200 μΩ.cm | 0.3 | 0.012 |
| | RA Product | Spin Injection Efficiency | |
| MTJ | 5 Ω.μm$^2$ (P)<br>10 Ω.μm$^2$ (AP) | 80% | 0.007 |

US 9,460,768 B2

CROSS POINT ARRAY MRAM HAVING SPIN HALL MTJ DEVICES

CLAIM OF PRIORITY

This application is a U.S. National Phase application under 35 U.S.C. §371 of International Application No. PCT/US2013/031699, filed Mar. 14, 2013, entitled "CROSS POINT ARRAY MRAM HAVING SPIN HALL MTJ DEVICES," the entire contents of which are incorporated herein by reference.

TECHNICAL FIELD

Embodiments of the invention are in the field of memory devices and, in particular, cross point array magnetoresistive random access memory (MRAM) implementing spin hall magnetic tunnel junction (MTJ)-based devices and methods of operation of such arrays.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Non-volatile embedded memory, e.g., on-chip embedded memory with non-volatility can enable energy and computational efficiency. However, leading embedded memory options such as spin torque transfer magnetoresistive random access memory (STT-MRAM) can suffer from high voltage and high current-density problems during the programming (writing) of the cell. Furthermore, the may be density limitations of STT-MRAM due to large write switching current and select transistor requirements. Specifically, traditional STT-MRAM has a cell size limitation due to the drive transistor requirement to provide sufficient spin current. Furthermore, such memory is associated with large write current (>100 µA) and voltage (>0.7 V) requirements of conventional magnetic tunnel junction (MTJ) based devices.

As such, significant improvements are still needed in the area of non-volatile memory arrays based on MTJs.

DESCRIPTION OF THE EMBODIMENTS

Cross point array magnetoresistive random access memory (MRAM) implementing spin hall magnetic tunnel junction (MTJ)-based devices and methods of operation of such arrays are described. In the following description, numerous specific details are set forth, such as specific magnetic tunnel junction (MTJ) layer regimes, in order to provide a thorough understanding of embodiments of the present invention. It will be apparent to one skilled in the art that embodiments of the present invention may be practiced without these specific details. In other instances, well-known features, such as integration processing fabrication flows, are not described in detail in order to not unnecessarily obscure embodiments of the present invention. Furthermore, it is to be understood that the various embodiments shown in the Figures are illustrative representations and are not necessarily drawn to scale.

One or embodiments of the present invention is directed to a cross point array MRAM using spin hall MTJ devices. General applications of such an array include, but are not limited to, embedded memory, magnetic tunnel junction architectures, MRAM, non-volatile memory, spin hall effects, spin torque memory, and embedded memory using magnetic memory devices. In one embodiment, MTJ based spin torque MRAM is improved in density and energy/bit using spin hall devices as described herein.

More specifically, one or more embodiments target the use or application of highly compact giant spin hall effect MRAM (GSHE-MRAM) using cross-connect architecture. In a first aspect, low programming (write) currents and voltages are enabled by giant spin Hall Effect (GSHE). In a second aspect, high density cross connect architecture with no select transistor in each bit cell is realized. Embodiments include the fabrication and/or implementation of an array of GSHE-MTJ cells formed in a cross-point architecture and may involve one or more of cross connected spin hall MRAM, a bit cell layout using three metal layers, and/or a cross connected bit cell using GSHE-MTJ MRAM.

Figure 1:
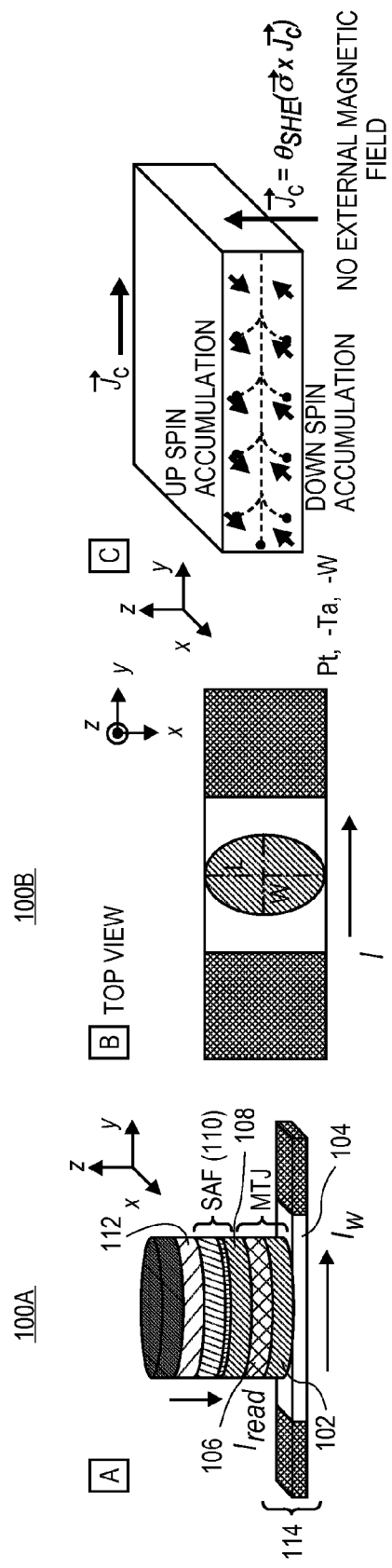
FIG. 1 illustrates the working mechanism of a giant spin Hall Effect magnetic tunnel junction (GSHE-MTJ) device with (a) an illustrated typical material stack for GSHE-MTJ, (b) an illustrated top view of the device of (a), and (c) an illustration depicting direction of the spin currents and charge currents as determined by spin Hall Effect in metals, in accordance with the prior art.

In one aspect, a giant spin hall effect (GSHE) MRAM cross connected array based on spin Hall Effect based programming (writing) of a magnetic element and MTJ based read-out is described. In order to provide context, FIG. 1 is provided to aid with illustration of the operating principle of giant spin hall MRAM. Specifically, FIG. 1 illustrates the working mechanism of a GSHE-MTJ with (a) an illustrated typical material stack 100A for GSHE-MTJ, (b) an illustrated top view 100B of the device of (a), and (c) an illustration depicting direction of the spin currents and charge currents as determined by spin Hall Effect in metals, in accordance with the prior art.

With reference again to FIG. 1, a nominal geometry of a 3-terminal memory cell with a spin Hall Effect induced write mechanism and MTJ based read-out is shown. The nominal material stack 100A includes a free layer nanomagnet 102 in direct contact with GSHE metal 104. The nominal MTJ stack is composed of the free layer 102 (FM1), a magnesium oxide (MgO) tunneling oxide 106, a fixed magnet 108 (FM2) with a synthetic anti-ferro-magnet (SAF) 110 which is CoFe/Ru based, and an anti-ferromagnet (AFM) 112. The SAF layers 110 allows for cancelling the dipole fields around the free layer 102. A wide combination of materials has been studied for this material stacking. For example, the write electrode 114 includes a GSHE metal composed of β-Tantalum (β-Ta), β-Tungsten (β-W) or platinum (Pt). The write electrode 114 transitions into a normal high conductivity metal (e.g., copper (Cu)) to minimize the write electrode resistance. The top view 100B of the device reveals that magnet is oriented along the width of the GSHE electrode for appropriate spin injection.

Referring again to FIG. 1, the magnetic cell is written by applying a charge current via the GSHE electrode. The direction of the magnetic writing is determined by the direction of the applied charge current. Positive currents (along +y) produce a spin injection current with transport direction (along +z) and spins pointing to (+x) direction. The injected spin current in-turn produces spin torque to align the magnet in the +x or −x direction. The transverse spin current for a charge current in the write electrode is provided in equation (1):

$$\vec{I}_s = P_{She}(w, t, \lambda_{sf}, \theta_{SHE})\left(\hat{\sigma} \times \vec{I}_c\right) \quad (1)$$

where $P_{SHE}$ is the spin hall injection efficiency which is the ratio of magnitude of transverse spin current to lateral charge current, w is the width of the magnet, t is the thickness of the GSHE metal electrode, $\lambda_{sf}$ is the spin flip length in the GSHE metal, $\theta_{GSHE}$ is the spin hall angle for the GSHE-metal to FM1 interface. The injected spin angular momentum responsible for spin torque can be determined by first solving equation 1.

In accordance with various embodiments of the present invention, bit cells and arrays for GSHE-MRAM cross connected memory are described below. In a first embodiment, a GSHE-MTJ stack is provided for which an antiferro-magnet (AFM) is the bottom layer of the stack. That is, in one embodiment, the bit cell for a GSHE-MTJ is based on a material stack having an AFM layer in the bottom layer. In an exemplary embodiment, a GSHE-MRAM bit cell is fabricated by a traditional process integration flow for MTJ integration. The bit cell has three terminals connected to a select line (SL), word line (WL) and bit line (BL), respectively. The write process for such an arrangement enables a current between BL and SL injecting spin current to the device. The read process involves reading the tunneling magneto-resistance (TMR) between SL and WL.

Figure 2A:
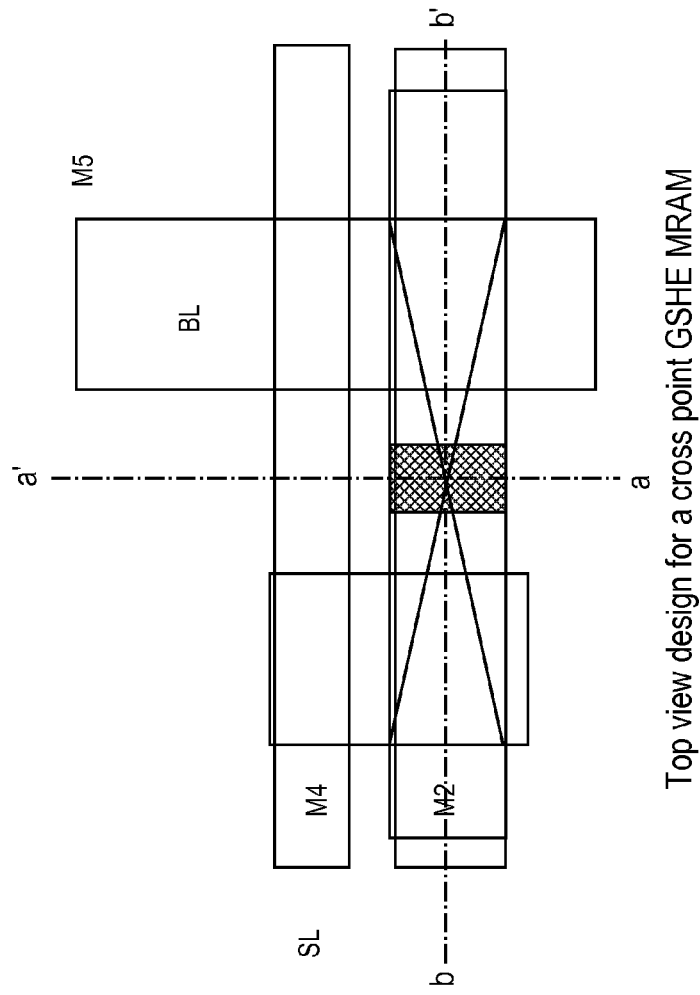
FIG. 2A illustrates a cross-sectional view of a bit cell having connectivity to a select line (SL), a bit line (BL), and a word line (WL), along with a corresponding a top view schematic of the device, in accordance with an embodiment of the present invention.
Figure 2A:
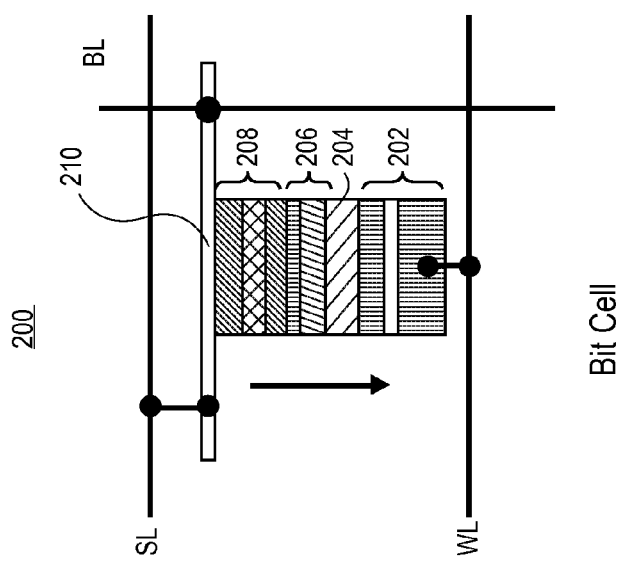

By way of example, FIG. 2A illustrates a cross-sectional view of a bit cell 200 having connectivity to a select line (SL), a bit line (BL), and a word line (WL), along with a corresponding top view schematic of the device 200, in accordance with an embodiment of the present invention. Referring to FIG. 2A, the bit cell 200 as shown can be used for cross-point GSHE-MRAM, e.g., using metal layers M2, M3, M4, and M5. In a specific embodiment, the material stack of the bit cell 200 includes, with respect to orientation of an underlying substrate (not shown), a bottom electrode 202 (e.g., Ru/Ta/Ru), an AFM layer 204 (e.g., IrMn), an SAF stack 206 (e.g., CoFe/Ru), an MTJ stack 208 (e.g., CoFeB/MgO/CoFeB), and a spin hall metal electrode 210. It is to be understood that the specific materials shown are for exemplary purposes only. Other possible materials for the above listed layers are described in greater detail below. For further clarity, FIG. 2B illustrates cross-section views of the device of FIG. 2A (a) as taken along the axis a-a' and (b) as taken along the axis b-b', in accordance with an embodiment of the present invention.

Figure 2B:
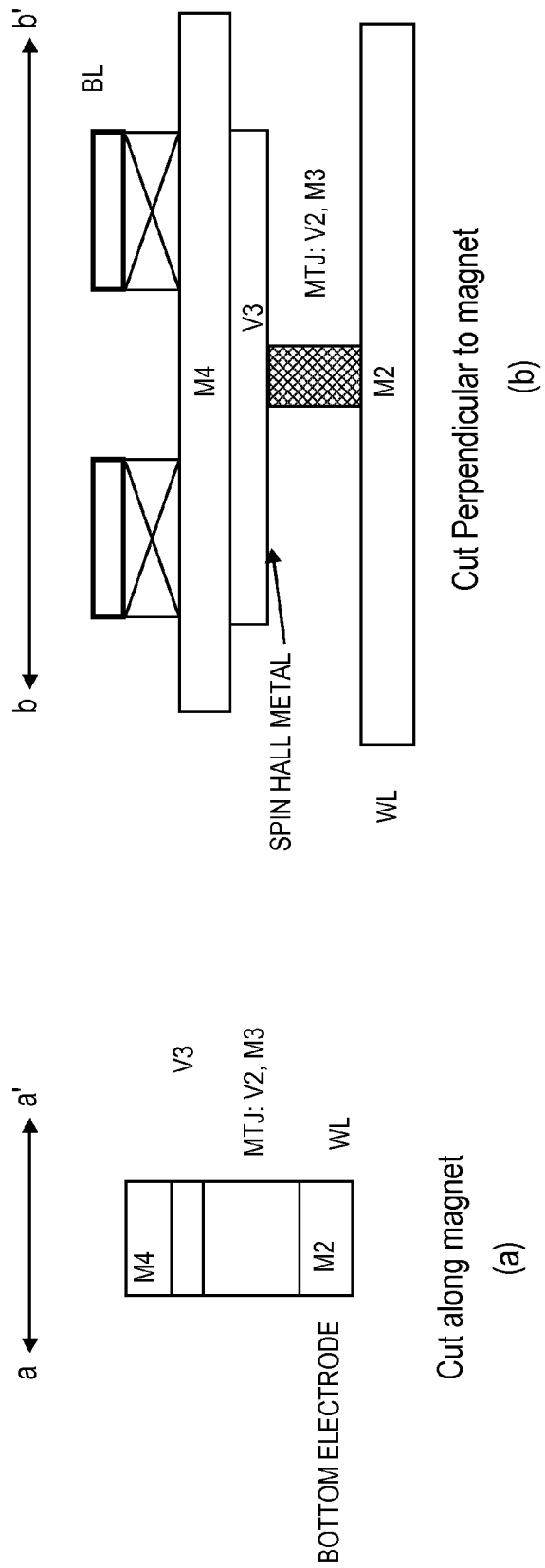
FIG. 2B illustrates cross-section views of the device of FIG. 2A (a) as taken along the axis a-a' and (b) as taken along the axis b-b', in accordance with an embodiment of the present invention.

An important aspect of the device described in association with FIGS. 2A and 2B is that, in an embodiment, the GSHE-cross point MRAM bit cell does not require use of a select transistor. The exclusion of a select transistor may be realized since the device employs four unidirectional metal layers. In one such embodiment, the back end area of the device per bit cell is, for a back end MRAM density for a single layer MRAM, provided in equation (2):

$$A_{GSHE-CP} = 16F_{M2}F_{M5} \quad (2)$$

For the device described in association with FIGS. 2A and 2B, the spin hall metal layer (e.g., of electrode 210) is formed into a metal or via layer (V3) directly adjacent to the free layer (e.g., top CoFeB layer of MTJ stack 208). The MTJ is incorporated into V2 and M3 layers. M2 acts as the word-line to read the MTJ tunneling magneto-resistance between SL and WL.

Figure 3:
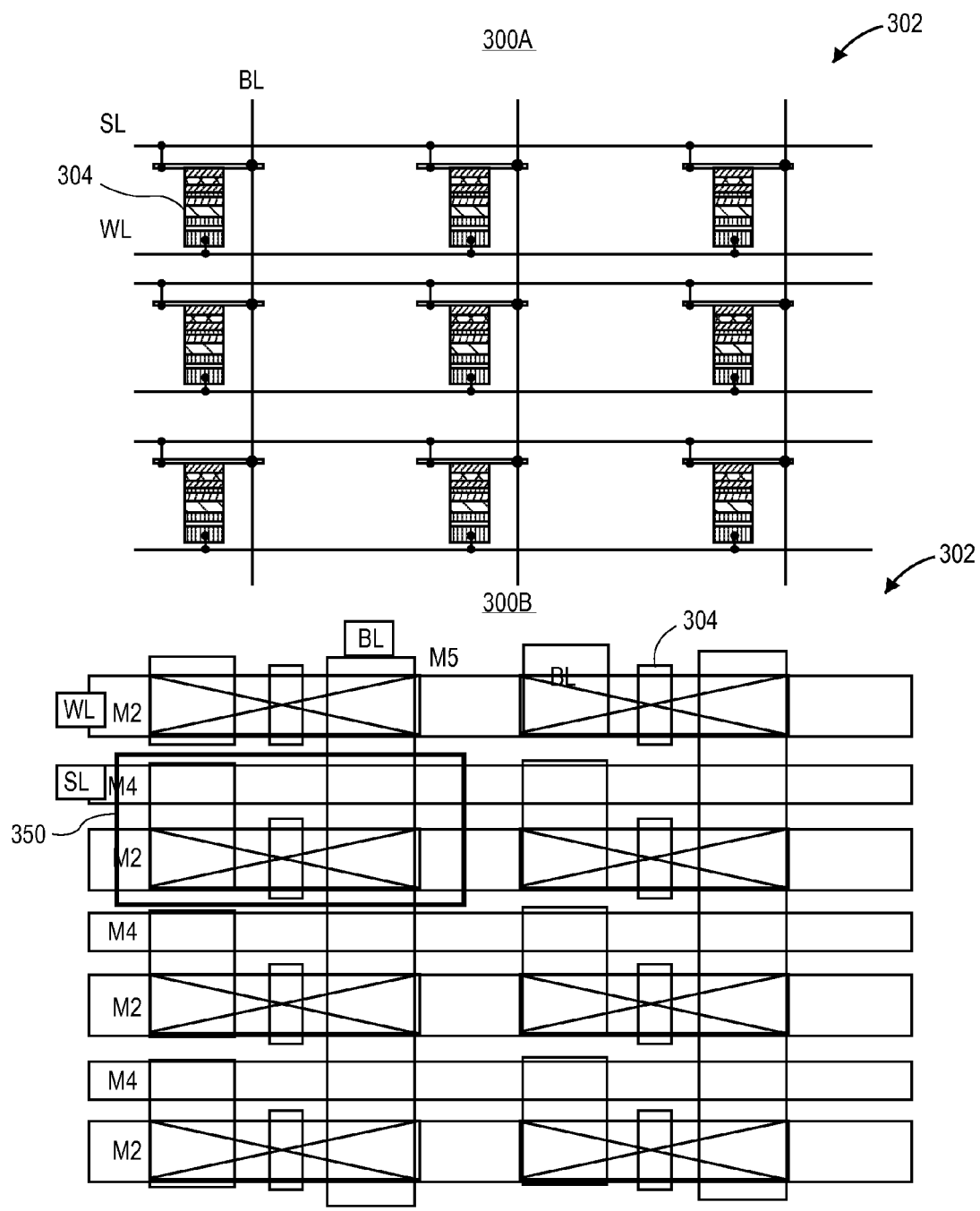
FIG. 3 illustrates (a) a bit cell perspective view and (b) a plan view of a cross-point array having bit cells with bottom AFM layers, in accordance with an embodiment of the present invention.

In another aspect, the device of FIGS. 2A and 2B can be included in a cross point array to provide GSHE-MRAM with each bit cell having an AFM layer in the bottom layer. Specifically, in an embodiment, a bit cell having the arrangement of device 200 is implemented in a cross-point array GSHE-MRAM. For example, FIG. 3 illustrates (a) a bit cell perspective view 300A and (b) a plan view 300B of a cross-point array 302 having bit cells 304 with bottom AFM layers, in accordance with an embodiment of the present invention. In one embodiment, the MRAM array 302 is for cross-point GSHE-MRAM and utilizes unidirectional metal layers M2, M3, M4, M5, as depicted in FIG. 3. The direction of the metal layer in direct contact with the magnet is chosen such that appropriate spin current is injected into the magnets. Bit lines are common along the columns and WL and SL are common along the rows. The write and read paths and disturbs are described below. The boxed section 350 shows a unit bit cell.

Figure 4:
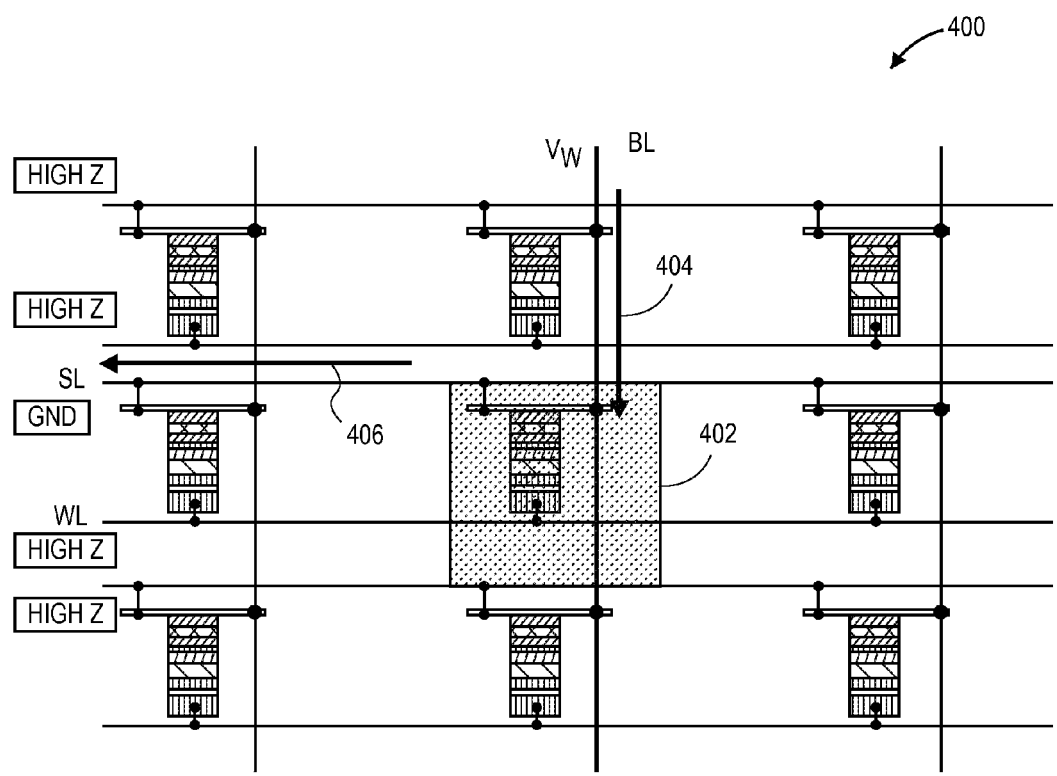
FIG. 4 illustrates a method for writing logic 1 in a cross point GSHE-MRAM, in accordance with an embodiment of the present invention.

With respect to writing a Logic 1 to a bit cell of the array 302 of FIG. 3, FIG. 4 illustrates a method for writing logic 1 in a cross point GSHE-MRAM 400, in accordance with an embodiment of the present invention. Referring to FIG. 4, Logic 1 is programmed to the highlighted cell 402 by increasing the BL voltage 404 to write voltage ($V_W$) and reducing the SL voltage 406 to ground (Gnd). The remaining lines are in high impedance condition (High Z) to avoid write disturbs.

Figure 5:
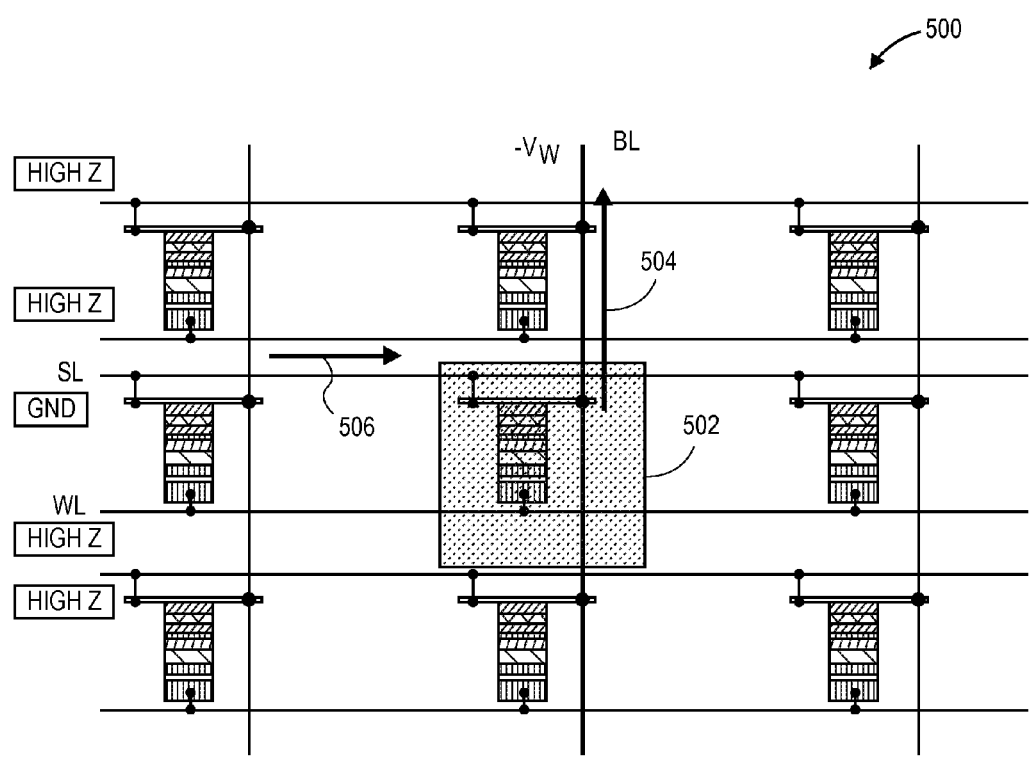
FIG. 5 illustrates a method for writing logic 0 in a cross point GSHE-MRAM, in accordance with an embodiment of the present invention.

With respect to writing a Logic 0 to a bit cell of the array 302 of FIG. 3, FIG. 5 illustrates a method for writing logic 0 in a cross point GSHE-MRAM 500, in accordance with an embodiment of the present invention. Referring to FIG. 5, Logic 0 is programmed to the highlighted cell 502 by decreasing the BL voltage 504 to negative write voltage ($-V_W$) and reducing the SL voltage 506 to ground (Gnd). The remaining lines are in high impedance condition (High Z) to avoid write disturbs.

Figure 6:
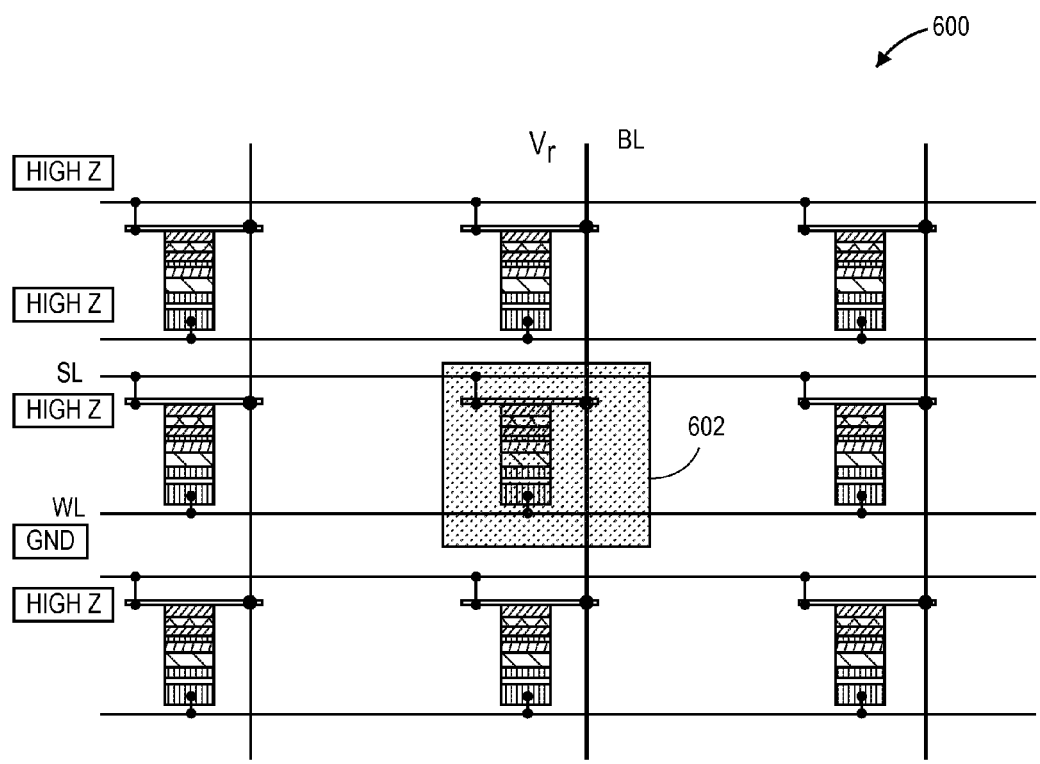
FIG. 6 illustrates a method of reading a bit cell in a cross point GSHE-MRAM, in accordance with an embodiment of the present invention.

With respect to reading a bit cell of the array 302 of FIG. 3, FIG. 6 illustrates a method of reading a bit cell in a cross point GSHE-MRAM 600, in accordance with an embodiment of the present invention. Referring to FIG. 6, the resistance (MR) between SL and WL is measured), i.e., the highlighted bit cell 602 is read out, by applying a low read voltage between BL and WL. Remaining lines are in high-Z state. A method to overcome freak currents associated with such reading is described in greater detail below.

In another aspect, an estimate of front end effective area per bit cell in cross connected GSHE MRAM (including read and write circuitry) may be determined. In an embodiment, the front end area per bit cell is average over the array as provided in equation (3):

$$A_{GSHE-CP-FE} = \frac{N \times A_{SA} + N \times A_{Write} + M \times A_{se}}{N \times M} \quad (3)$$

where N is bits per word, M is the number of words per array, $A_{SA}$ is area of the sense amplifier, $A_{se}$ is the area of the selector per word, and $A_{Write}$ is the write circuitry. For a typical sense amplifier, write and selector dimensions (e.g., $A_{SA}$ approximately $40F^2$, $A_{Write}$ approximately $37F^2$, $A_{se}$ equals $112 F^2$). In a specific embodiment, for a 1024×1024 array, the front end requirement for select, sense and write circuits per cell is provided in equation (4):

$$A_{GSHE-CP-FE} = \frac{N \times A_{SA} + N \times A_{Write} + M \times A_{se}}{N \times M} \approx 0.18 \ F^2 \quad (4)$$

Figure 7:
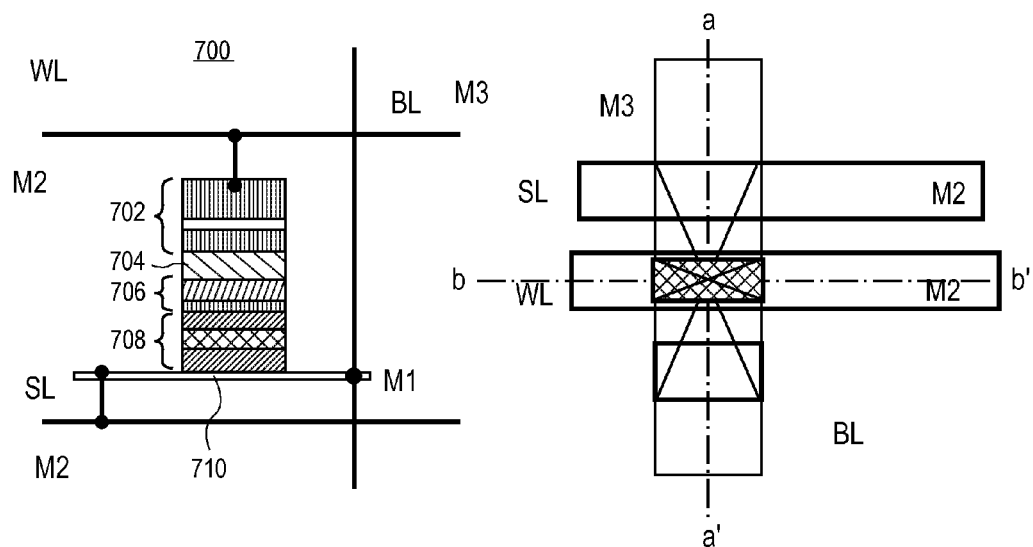
FIG. 7 illustrates a cross-sectional view of another bit cell having connectivity to a select line (SL), a bit line (BL), and a word line (WL), along with a corresponding a top view schematic of the device, in accordance with an embodiment of the present invention.
Figure 8:
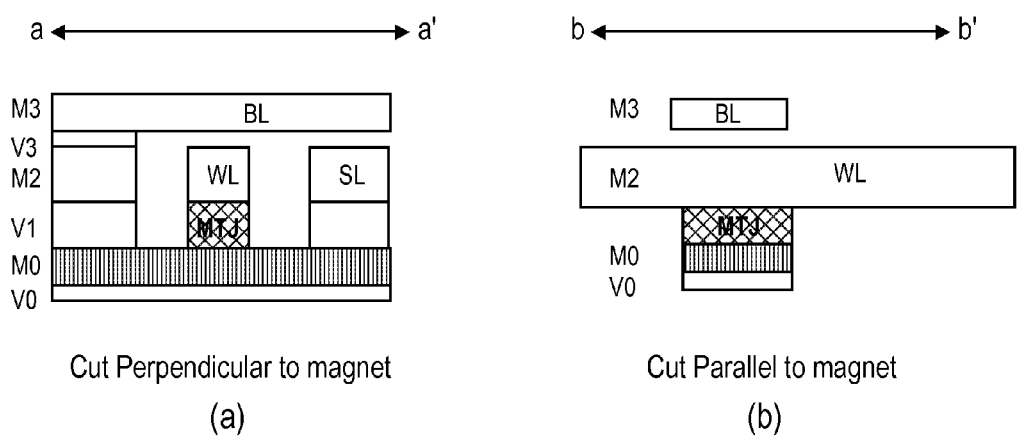
FIG. 8 illustrates cross-section views of the device of FIG. 7 (a) as taken along the axis a-a' and (b) as taken along the axis b-b', in accordance with an embodiment of the present invention.

In another aspect, a GSHE-MTJ stack may be provided wherein the anti-ferro-magnet (AFM) layer is a top layer in a bit cell. In an embodiment, a GSHE-MTJ stack includes the AFM layer as the top layer in order to reduce the back end footprint of the GSHE cross-point array and, thus, to provide higher densities. In an example, FIG. 7 illustrates a cross-sectional view of another bit cell 700 having connectivity to a select line (SL), a bit line (BL), and a word line (WL), along with a corresponding a top view schematic of the device 700, in accordance with an embodiment of the present invention. Referring to FIG. 7, the bit cell 700 as shown can be used for cross-point GSHE-MRAM, e.g., using metal layers M2, M3, M4, and M5. In a specific embodiment, the material stack of the bit cell 700 includes, with respect to orientation of an underlying substrate (not shown), a top electrode 702 (e.g., Ru/Ta/Ru), an AFM layer 704 (e.g., IrMn), an SAF stack 706 (e.g., CoFe/Ru), an MTJ stack 708 (e.g., CoFeB/MgO/CoFeB), and a bottom spin hall metal electrode 710. It is to be understood that the specific materials shown are for exemplary purposes only. Other possible materials for the above listed layers are described in greater detail below. For further clarity, FIG. 8 illustrates cross-section views of the device of FIG. 7 (a) as taken along the axis a-a' and (b) as taken along the axis b-b', in accordance with an embodiment of the present invention. The device of FIG. 7 can, in an embodiment, be used in compact cross-point GSHE-MRAM with inverted MTJ stacks. The bit cell is read out by a weak read voltage applied between BL and WL. Remaining lines are in high-Z state. The device can be, in one embodiment, formed between metal layers M1-M3, as depicted in FIG. 8.

Figure 9:
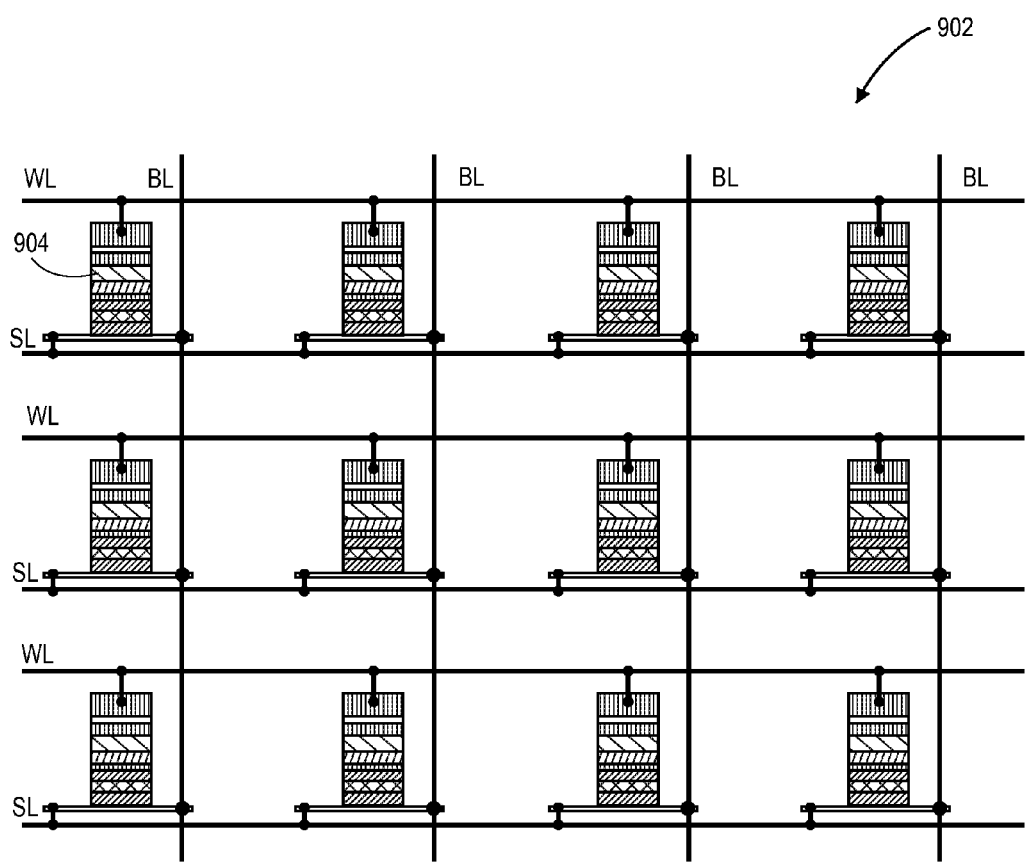
FIG. 9 illustrates a bit cell perspective view a cross-point array having bit cells with top AFM layers, in accordance with an embodiment of the present invention.
Figure 10:
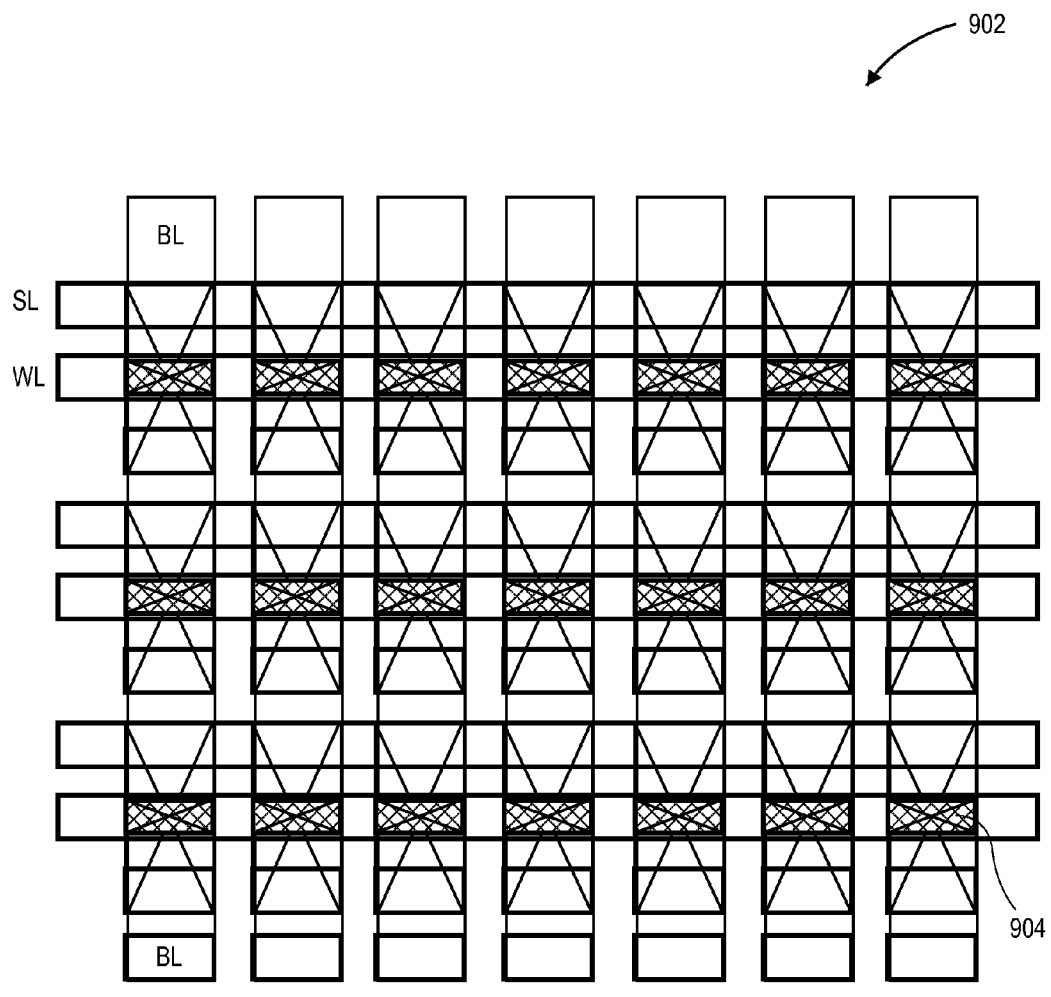
FIG. 10 is a plan view of the cross-point array of FIG. 9, in accordance with an embodiment of the present invention.

Thus, in another aspect, the device of FIGS. 7 and 8 can be included in a cross point array to provide GSHE-MRAM with each bit cell having an AFM layer in the top layer. Specifically, in an embodiment, a bit cell having the arrangement of device 700 is implemented in a cross-point array GSHE-MRAM. For example, FIG. 9 illustrates a bit cell perspective view a cross-point array 902 having bit cells 904 with top AFM layers, in accordance with an embodiment of the present invention. FIG. 10 is a plan view of the cross-point array 902 of FIG. 9. Thus, referring to FIGS. 9 and 10, a compact cross point array for GSHE-MRAM with an AFM layer in the top layer of the bit cell. The back end MRAM density for one associated layer of MRAM is provided in equation (5):

$$A_{GSHE-CP} = 12F_{M2}F_{M3} \quad (5)$$

In another aspect, traditionally, cross point array memories suffer from freak current which may limit the achievable maximum size of the array. In order to address such issues, in accordance with an embodiment of the present invention, a pre-charging, high-Z, row program technique is used to reduce the impact of freak currents. For example, in one such embodiment, a method to avoid freak currents in GSHE-MRAM cross-point array involves pre-charge of SL and WL to the appropriate voltages to place SL and BL in high impedance states (e.g., after charging). In another such embodiment, a method includes programming a full row (e.g., word) for each write operation. Both approaches are described in more detail below.

Figure 11:
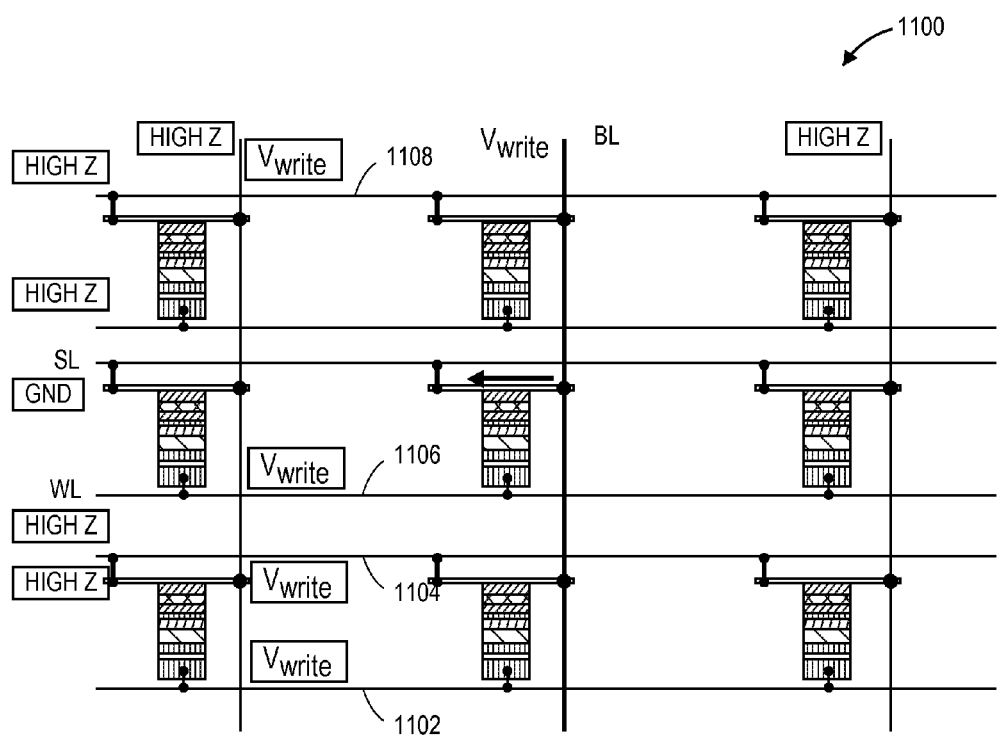
FIG. 11 illustrates a method of writing logic 1 in a cross point GSHE-MRAM to avoid freak currents, in accordance with an embodiment of the present invention.
Figure 12:
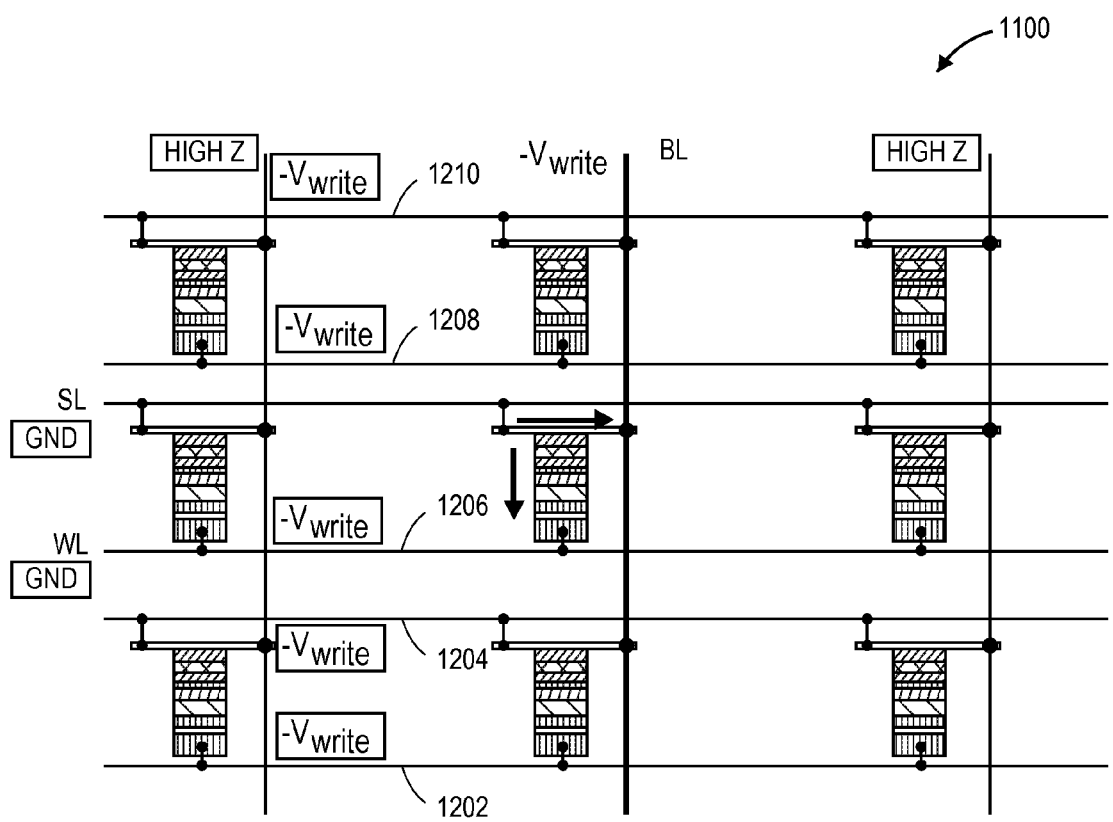
FIG. 12 illustrates a method of writing logic 0 in a cross point GSHE-MRAM to avoid freak currents, in accordance with an embodiment of the present invention.

In a first embodiment, an approach to avoiding write and read disturbs involves pre-charge of the lines to avoid freak currents and to place them in high impedance states. As an example, FIG. 11 illustrates a method of writing logic 1 in a cross point GSHE-MRAM 1100 to avoid freak currents, in accordance with an embodiment of the present invention. Referring to FIG. 11, the SL and WL of non-selected rows 1102, 1104, 1106 and 1108 are charged to $V_{write}$ $V_{write}/2$ and placed in a high impedance state (high Z). As another example, FIG. 12 illustrates a method of writing logic 0 in a cross point GSHE-MRAM 1200 to avoid freak currents, in accordance with an embodiment of the present invention. Referring to FIG. 12, the SL and WL of non-selected rows 1202, 1204, 1206, 1208 and 1210 are charged to $-V_{write}$ or $-V_{write}/2$ and placed in a high impedance state (high Z).

Figure 13:
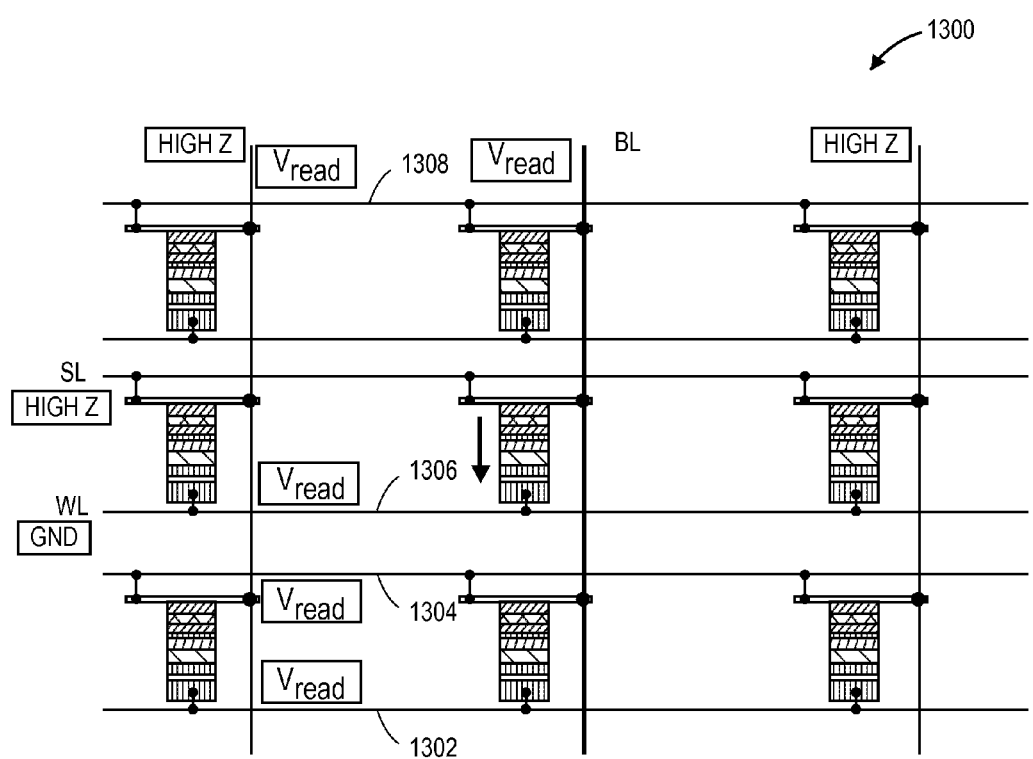
FIG. 13 illustrates a method of reading a cross point GSHE-MRAM to avoid freak currents, in accordance with an embodiment of the present invention.

In a second embodiment, an approach to avoiding write and read disturbs involves a particular reading approach. For example, FIG. 13 illustrates a method of reading a cross point GSHE-MRAM 1300 to avoid freak currents, in accordance with an embodiment of the present invention. Referring to FIG. 13, the SL and WL of non-selected rows 1302, 1304, 1306 and 1308 are charged to $V_{read}$ and placed in a high impedance state (high Z).

Overall, in comparison with conventional MTJ based MRAM, energy, delay and voltage benefits of spin hall effect memory can be realized. Such energy and voltage benefits of spin hall effect memory have been verified using analytical and nanomagnetic simulations. The analytical relationship connecting the switching time to the write voltage of a spin torque memory with critical voltage, vc, provided in equations (6) and (7):

$$\tau = \frac{\tau_0 \ln(\pi/2\theta_0)}{(v/v_c - 1)} \quad (6)$$

$$v_{cSHE} = 8\rho I_c \left( \theta_{she} \left(1 - \mathrm{sech}\left(\frac{t}{\lambda_{sf}}\right)\right) \pi L \right)^{-1} \quad (7)$$

where $\theta_0$ is the effect of stochastic variation due to thermal noise and is based on the thermal barrier of the magnet of volume, saturation magnetization and anisotropy, and where $\tau 0$ is the characteristic time. Ic is the critical current for spin torque induced magnetic switching. The validity of equation 6 has been verified via stochastic spin torque simulations of a nanomagnet.

Figure 14:
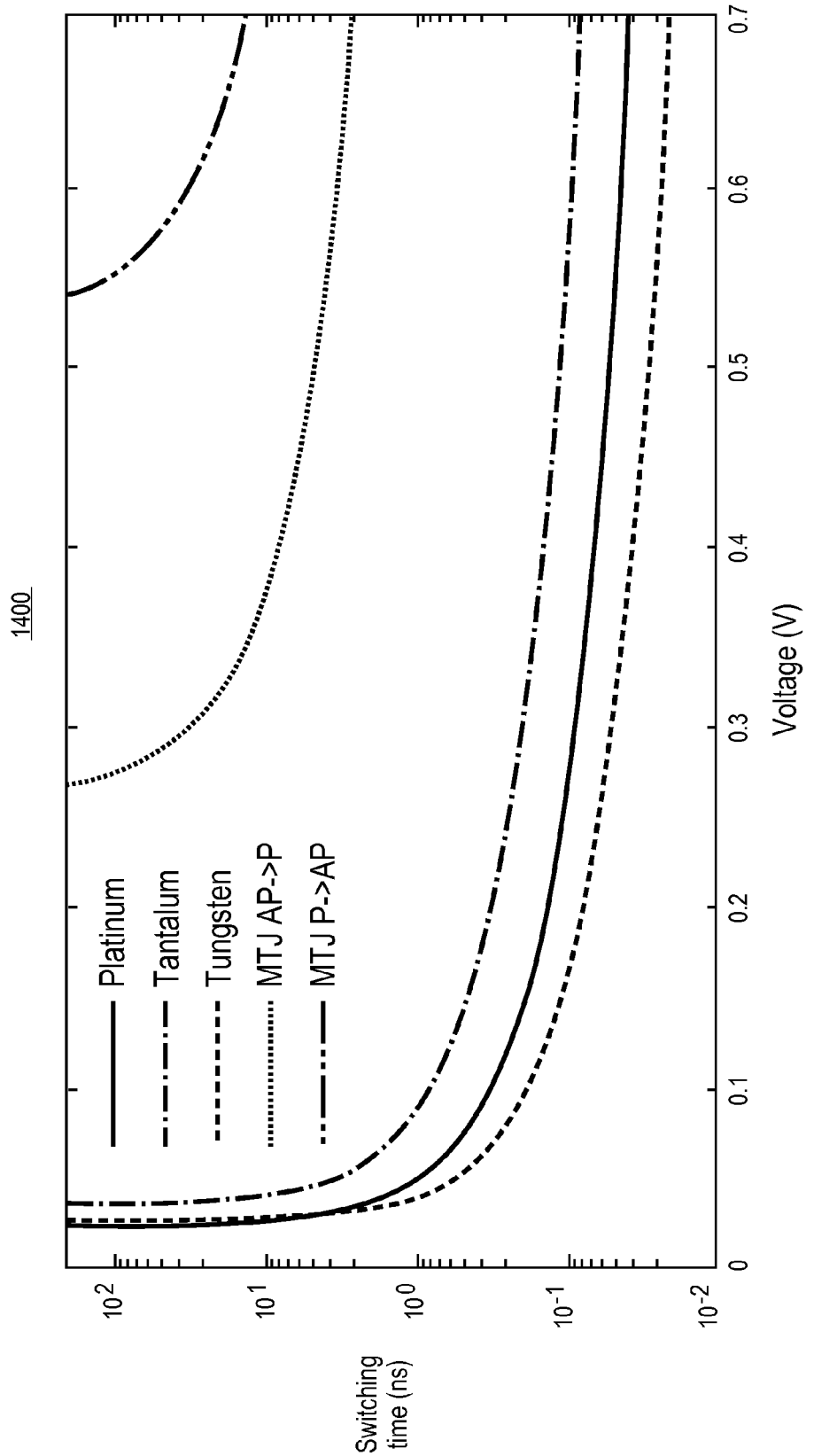
FIG. 14 is a plot of Switching time (in ns) as a function of applied voltage (in V) for a STT switching device using a GSHE or MTJ based writing mechanism, in accordance with an embodiment of the present invention.

The voltage Vs switching time of Spin Hall effect switching is plotted in FIG. 14. Specifically, FIG. 14 is a plot 1400 of Switching time (in ns) as a function of applied voltage (in V) for a STT switching device using a GSHE or MTJ based writing mechanism, in accordance with an embodiment of the present invention. For identical switching dynamics (e.g., identical delay and critical currents), the relative switching energy of GSHE writing to MTJ STT devices is provided in equation (8):

$$\frac{E_{she}}{E_{MTJP}} = \left(\frac{P_{MTJ}^2}{R_{MTJP}}\right)\left(\frac{R_{she}}{P_{she}^2}\right) = \left(\frac{P_{MTJ}^2}{R_{MTJP}}\right)\frac{32\rho_{she}t}{\pi^2 w l \theta_{SHE}^2 \left(1 - \mathrm{sech}\left(\frac{t}{\lambda_{sf}}\right)\right)^2} \quad (8)$$

Figures 15, 16:
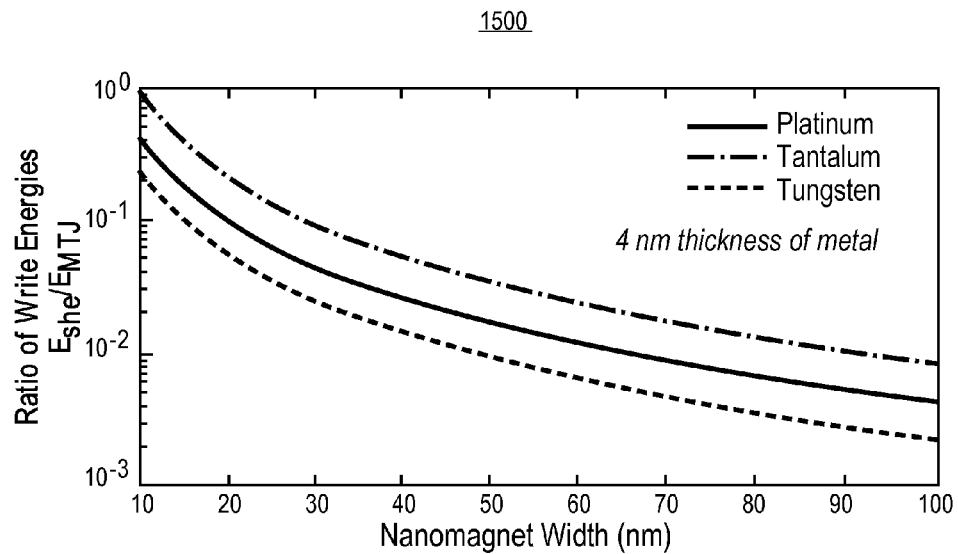
FIG. 15 is a plot showing relative switching energy for GSHE and MTJ based magnetic memory writing for varying nanomagnet width for a GSHE metal with thickness 4 nm, in accordance with an embodiment of the present invention.
FIG. 16 is a Table of material and transport parameters, in accordance with an embodiment of the present invention.

To understand the effect of dimensional scaling, the ratio of the energy required to switch using identical nanomagnets (e.g., with identical barrier, damping and critical currents) are plotted in FIG. 15. Specifically, FIG. 15 is a plot 1500 showing relative switching energy for GSHE and MTJ based magnetic memory writing for varying nanomagnet width for a GSHE metal with thickness 4 nm, in accordance with an embodiment of the present invention. Referring to plot 1500, the relative energy scales with resistance of the write electrode are inversely proportional to the square of the spin injection efficiency. For MTJ devices, the first product of equation (8) is fundamentally constrained since reducing the tunneling resistance is coupled with reducing spin polarization. As an example of material parameters, FIG. 16 is a Table 1600 of material and transport parameters, in accordance with an embodiment of the present invention.

Referring again to FIGS. 2A and 7, in an embodiment, the spin hall metal electrode 210 or 710, respectively, is composed of a metal such as, but not limited to, β-Tantalum (β-Ta), β-Tungsten (β-W) or platinum (Pt) where the electrode is in contact with the corresponding MTJ 208 or 708. In one embodiment, the spin hall metal electrode 210 or 710 transitions into a normal high conductivity metal (e.g., copper (Cu)) on either end of the electrode.

Referring again to FIGS. 2A and 7, in an embodiment, the magnetic layer of the corresponding MTJ stacks 208 and 708 that is closest to the electrode 210 or 710, respectively, is a free magnetic layer. The free magnetic layer is composed of a material suitable for transitioning between a majority spin and a minority spin, depending on the application. Thus, the free magnetic layer (or memory layer) may be referred to as a ferromagnetic memory layer. In one embodiment, the free magnetic layer is composed of a layer of cobalt iron (CoFe) or cobalt iron boron (CoFeB).

Referring again to FIGS. 2A and 7, in an embodiment, the magnetic layer of the corresponding MTJ stacks 208 and 708 that is farthest from the electrode 210 or 710, respectively, is a fixed magnetic layer. The fixed magnetic layer is composed of a material or stack of materials suitable for maintaining a fixed majority spin. Thus, the fixed magnetic layer (or reference layer) may be referred to as a ferromagnetic layer. In one embodiment, the fixed magnetic layer is composed of a single layer of cobalt iron boron (CoFeB). However, in another embodiment, the fixed magnetic layer is composed of a cobalt iron boron (CoFeB) layer, ruthenium (Ru) layer, cobalt iron boron (CoFeB) layer stack.

Referring again to FIGS. 2A and 7, in an embodiment, the layer of the corresponding MTJ stacks 208 and 708 that is between the fixed and free magnetic layers is a dielectric layer. The dielectric layer is composed of a material suitable for allowing current of a majority spin to pass through the layer, while impeding at least to some extent current of a minority spin to pass through the layer. Thus, the dielectric layer (or spin filter layer) may be referred to as a tunneling layer. In one embodiment, the dielectric layer is composed of a material such as, but not limited to, magnesium oxide (MgO) or aluminum oxide ($Al_2O_3$). In one embodiment, the dielectric layer has a thickness of approximately 1 nanometer.

In an embodiment, a synthetic antiferromagnet (SAF) is disposed adjacent the fixed magnetic layer. For example, portions 206 and 706 of bit cells 200 and 700, respectively, include a Ru/CoFe stack. It is to be understood that, in one embodiment, the Ru thickness is very specific, e.g., 8-9 Angstroms such that the coupling between the CoFeB (fixed layer) and the CoFe is anti-ferromagnetic, i.e., they point in opposite directions. In an embodiment, an antiferromagnetic layer (e.g., IrMn) 204 or 704, respectively, is included adjacent the SAF stacks 206 and 706, respectively.

Referring again to FIGS. 2A and 7, in an embodiment, the electrode 202 or 702 opposite the spin hall electrode 210 or 710, respectively, is composed of a material or stack of materials suitable for electrically contacting the fixed magnetic layer side of bit cell 200 or 700. In an embodiment, the electrode 202 or 702 is a topographically smooth electrode. In one such embodiment, the electrode 202 or 702 has a thickness suitable for good conductivity but has little to no columnar structure formation that would otherwise lead to a rough top surface. Such a topographically smooth electrode may be referred to as amorphous in structure. In a specific embodiment, the electrode 202 or 702 is composed of Ru layers interleaved with Ta layers. Effectively, in accordance with an embodiment of the present invention, the electrode 202 or 702 may not be not a conventional thick single metal electrode, such as a Ru electrode, but is instead a Ru/Ta interleaved materials stack. In alternative embodiments, however, the electrode 202 or 702 is a conventional thick single metal electrode, such as a Ru electrode.

In certain aspects and at least some embodiments of the present invention, certain terms hold certain definable meanings. For example, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric or tunneling oxide, is one located between free and fixed magnetic layers. A fixed magnetic layer may be patterned to create inputs and outputs to an associated circuit. Magnetization may be written by spin Hall Effect. Magnetization may be read via the tunneling magneto-resistance effect while applying a voltage. In an embodiment, the role of the dielectric layer is to cause a large magneto-resistance ratio. The magneto-resistance is the ratio of the difference between resistances when the two ferromagnetic layers have anti-parallel magnetizations and the resistance of the state with the parallel magnetizations.

In an embodiment, the MTJ (e.g., MTJ 208 or 708) functions essentially as a resistor, where the resistance of an electrical path through the MTJ may exist in two resistive states, either "high" or "low," depending on the direction or orientation of magnetization in the free magnetic layer and in the fixed magnetic layer. In the case that the spin direction is of minority in the free magnetic layer, a high resistive state exists, wherein direction of magnetization in the free magnetic layer and the fixed magnetic layer are substantially opposed or anti-parallel with one another. In the case that the spin direction is of majority in the free magnetic layer, a low resistive state exists, wherein the direction of magnetization in the free magnetic layer and the fixed magnetic layer is substantially aligned or parallel with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

Thus, the MTJ may store a single bit of information ("0" or "1") by its state of magnetization. The information stored in the MTJ is sensed by driving a current through the MTJ. The free magnetic layer does not require power to retain its magnetic orientations. As such, the state of the MTJ is preserved when power to the device is removed. Therefore, a memory bit cell composed of the stack 208 or 708 of FIG. 2A or 7, respectively, is, in an embodiment, non-volatile.

Although the method of fabricating the stack of layers of bit cells 200 or 700 for, e.g., a memory bit cell has not been described complete detail herein, it is to be understood that the steps for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

Figure 17:
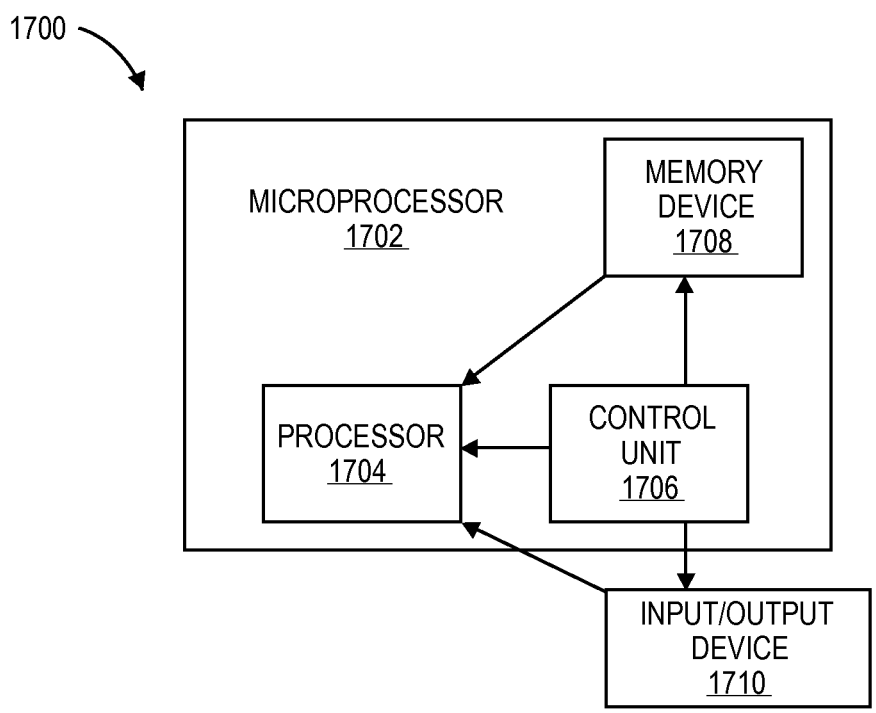
FIG. 17 illustrates a block diagram of an electronic system, in accordance with an embodiment of the present invention.

FIG. 17 illustrates a block diagram of an electronic system 1700, in accordance with an embodiment of the present invention. The electronic system 1700 can correspond to, for example, a portable system, a computer system, a process control system, or any other system that utilizes a processor and an associated memory. The electronic system 1700 may include a microprocessor 1702 (having a processor 1704 and control unit 1706), a memory device 1708, and an input/output device 1710 (it is to be understood that the electronic system 1700 may have a plurality of processors, control units, memory device units and/or input/output devices in various embodiments). In one embodiment, the electronic system 1700 has a set of instructions that define operations which are to be performed on data by the processor 1704, as well as, other transactions between the processor 1704, the memory device 1708, and the input/output device 1710. The control unit 1706 coordinates the operations of the processor 1704, the memory device 1708 and the input/output device 1710 by cycling through a set of operations that cause instructions to be retrieved from the memory device 1708 and executed. The memory device 1708 can include a cross point array magnetoresistive random access memory (MRAM) implementing spin hall magnetic tunnel junction (MTJ)-based devices, as described herein. In an embodiment, the memory device 1708 is embedded in the microprocessor 1702, as depicted in FIG. 17.

Figure 18:
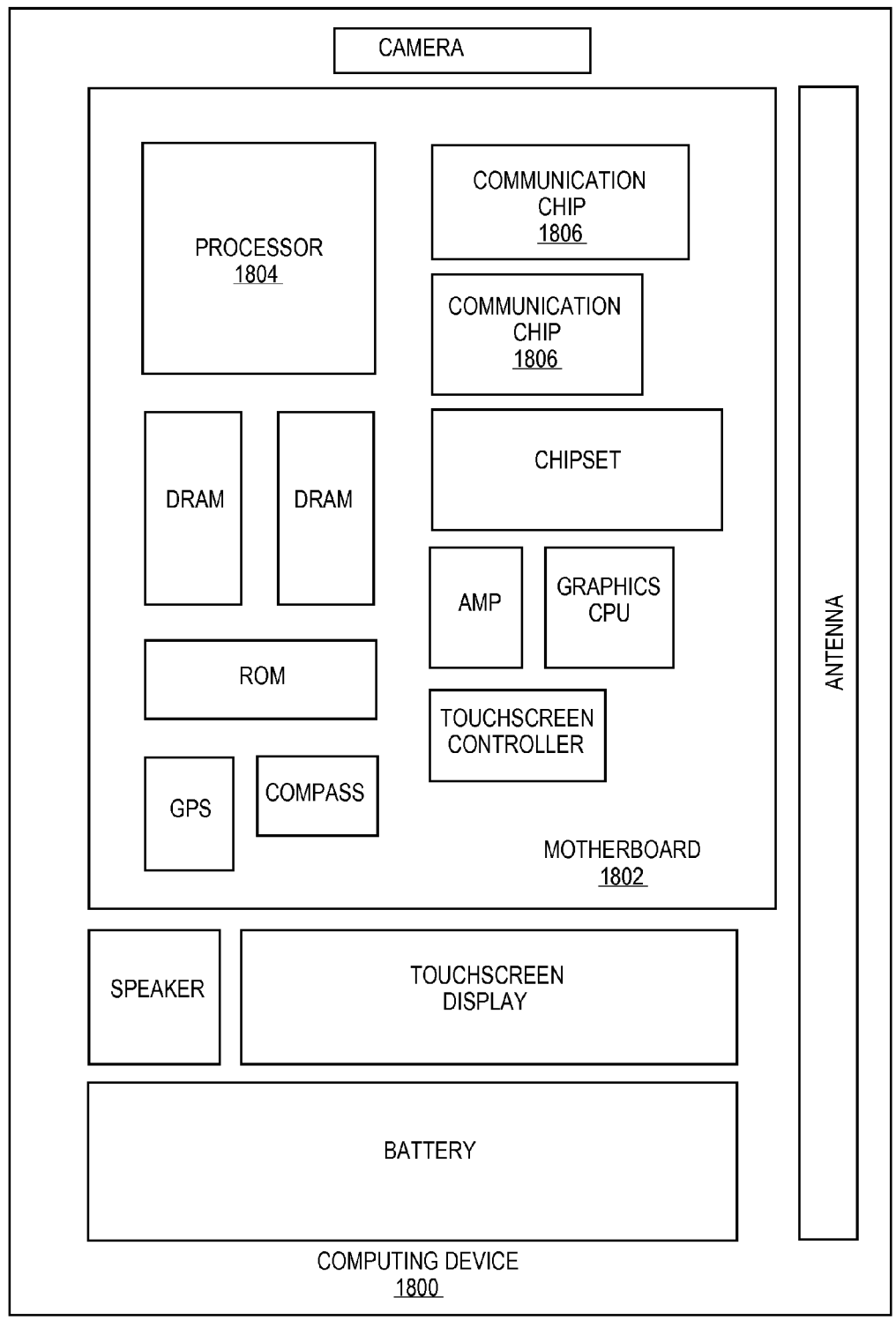
FIG. 18 illustrates a computing device in accordance with one embodiment of the invention.

FIG. 18 illustrates a computing device 1800 in accordance with one embodiment of the invention. The computing device 1800 houses a board 1802. The board 1802 may include a number of components, including but not limited to a processor 1804 and at least one communication chip 1806. The processor 1804 is physically and electrically coupled to the board 1802. In some implementations the at least one communication chip 1806 is also physically and electrically coupled to the board 1802. In further implementations, the communication chip 1806 is part of the processor 1804.

Depending on its applications, computing device 1800 may include other components that may or may not be physically and electrically coupled to the board 1802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1806 enables wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1800 may include a plurality of communication chips 1806. For instance, a first communication chip 1806 may be dedicated to shorter range wireless communications such as Wi-Fi and Bluetooth and a second communication chip 1806 may be dedicated to longer range wireless communications such as GPS, EDGE, GPRS, CDMA, WiMAX, LTE, Ev-DO, and others.

The processor 1804 of the computing device 1800 includes an integrated circuit die packaged within the processor 1804. In some implementations of the invention, the integrated circuit die of the processor includes one or more arrays, such as cross point array magnetoresistive random access memory (MRAM) implementing spin hall magnetic tunnel junction (MTJ)-based devices, built in accordance with embodiments of the present invention. The term "processor" may refer to any device or portion of a device that processes electronic data from registers and/or memory to transform that electronic data into other electronic data that may be stored in registers and/or memory.

The communication chip 1806 also includes an integrated circuit die packaged within the communication chip 1806. In accordance with another implementation of the invention, the integrated circuit die of the communication chip includes one or more arrays, such as cross point array magnetoresistive random access memory (MRAM) implementing spin hall magnetic tunnel junction (MTJ)-based devices, built in accordance with embodiments of the present invention.

In further implementations, another component housed within the computing device 1800 may contain a stand-alone integrated circuit memory die that includes one or more arrays, such as cross point array magnetoresistive random access memory (MRAM) implementing spin hall magnetic tunnel junction (MTJ)-based devices, built in accordance with embodiments of the present invention.

In various implementations, the computing device 1800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1800 may be any other electronic device that processes data.

Accordingly, one or more embodiments of the present invention relate generally to the fabrication of microelectronic memory. The microelectronic memory may be non-volatile, wherein the memory can retain stored information even when not powered. One or more embodiments of the present invention relate to the fabrication of cross point array magnetoresistive random access memory (MRAM) implementing spin hall magnetic tunnel junction (MTJ)-based devices for non-volatile microelectronic memory devices. Such an array may be used in an embedded non-volatile memory, either for its non-volatility, or as a replacement for embedded dynamic random access memory (eDRAM). For example, such an array may be used for 1T-1X memory (X=capacitor or resistor) at competitive cell sizes within a given technology node.

Thus, embodiments of the present invention include cross point array magnetoresistive random access memory (MRAM) implementing spin hall magnetic tunnel junction (MTJ)-based devices and methods of operation of such arrays.

In an embodiment, a bit cell for a non-volatile memory includes a magnetic tunnel junction (MTJ) stack disposed above a substrate and having a free magnetic layer disposed above a dielectric layer disposed above a fixed magnetic layer. The bit cell also includes a spin hall metal electrode disposed above the free magnetic layer of the MTJ stack.

In one embodiment, the spin hall metal electrode includes a metal such as, but not limited to, $\beta$-Tantalum ($\beta$-Ta), $\beta$-Tungsten ($\beta$-W) or platinum (Pt), and the metal is disposed on the free magnetic layer.

In one embodiment, the spin hall electrode further includes a second, different, metal on either side of the free magnetic layer.

In one embodiment, the spin hall metal electrode is disposed on the free magnetic layer, the free magnetic layer is disposed on the dielectric layer, the dielectric layer is disposed on the fixed magnetic layer, and the bit cell further includes a bottom electrode, an anti-ferromagnetic (AFM) layer disposed on the bottom electrode, and a synthetic anti-ferromagnet (SAF) stack disposed on the AFM layer. The MTJ stack is disposed on the SAF stack.

In one embodiment, the free magnetic layer is composed of CoFeB, the dielectric layer is composed of magnesium oxide (MgO), the fixed magnetic layer is composed of CoFeB, the SAF stack is composed of a layer of ruthenium (Ru) disposed on a layer of CoFe, the AFM layer is composed of IrMn, and the bottom electrode is composed of a Ru/Ta/Ru stack.

In one embodiment, the spin hall metal electrode has a first end and a second end, and the MTJ stack is disposed between the first and second ends. The bit cell further includes a bottom electrode, a word line coupled to the bottom electrode, a select line coupled to the first end of the spin hall metal electrode, and a bit line coupled to the second end of the spin hall metal electrode. The MTJ stack is disposed above, and coupled to, the bottom electrode.

In an embodiment, a cross-point array giant spin hall effect magnetoresistive random access memory (GSHE-MRAM) includes a plurality of bit cells, each bit cell having a spin hall metal electrode coupled with a magnetic tunnel junction (MTJ) stack, and has a second electrode coupled with the MTJ stack. A plurality of select lines is also included, each select line coupled to one or more of the plurality of bit cells at a first end of each spin hall metal electrode of the one or more of the plurality of bit cells. A plurality of bit lines is also included, each bit line coupled to one or more of the plurality of bit cells at a second, different, end of each spin hall metal electrode of the one or more of the plurality of bit cells. A plurality of word lines is also included, each word line coupled to one or more of the plurality of bit cells at the second electrode of each of the one or more of the plurality of bit cells.

In one embodiment, the spin hall metal electrode of each bit cell includes a metal such as, but not limited to, $\beta$-Tantalum ($\beta$-Ta), $\beta$-Tungsten ($\beta$-W) or platinum (Pt), and the metal is disposed on a free magnetic layer of the MTJ stack of the bit cell.

In one embodiment, the spin hall electrode further includes a second, different, metal on either side of the free magnetic layer.

In one embodiment, the spin hall metal electrode of each bit cell is disposed above a free magnetic layer of the MTJ stack of the bit cell, the free magnetic layer is disposed on a dielectric layer of the MTJ stack of the bit cell, the dielectric layer is disposed on a fixed magnetic layer of the MTJ stack of the bit cell, and each bit cell further includes a bottom electrode, an anti-ferromagnetic (AFM) layer disposed on the bottom electrode, and a synthetic anti-ferromagnet (SAF) stack disposed on the AFM layer. The MTJ stack is disposed on the SAF stack.

In one embodiment, the free magnetic layer is composed of CoFeB, the dielectric layer is composed of magnesium oxide (MgO), the fixed magnetic layer is composed of CoFeB, the SAF stack is composed of a layer of ruthenium (Ru) disposed on a layer of CoFe, the AFM layer is composed of IrMn, and the bottom electrode is composed of a Ru/Ta/Ru stack.

In one embodiment, the spin hall metal electrode of each bit cell is disposed below a free magnetic layer of the MTJ stack of the bit cell, the free magnetic layer is disposed below a dielectric layer of the MTJ stack of the bit cell, the dielectric layer is disposed below a fixed magnetic layer of the MTJ stack of the bit cell, and each bit cell further includes a top electrode, an anti-ferromagnetic (AFM) layer disposed below the bottom electrode, and a synthetic anti-ferromagnet (SAF) stack disposed below the AFM layer. The MTJ stack is disposed below the SAF stack.

In one embodiment, the free magnetic layer is composed of CoFeB, the dielectric layer is composed of magnesium oxide (MgO), the fixed magnetic layer is composed of CoFeB, the SAF stack is composed of a layer of ruthenium (Ru) disposed on a layer of CoFe, the AFM layer is composed of IrMn, and the top electrode is composed of a Ru/Ta/Ru stack.

In an embodiment, a method of writing a logic 1 to a bit cell in a cross-point array giant spin hall effect magnetoresistive random access memory (GSHE-MRAM) involves identifying a target bit cell in a plurality of bit cells, each bit cell having a spin hall metal electrode coupled with a magnetic tunnel junction (MTJ) stack, and a second electrode coupled with the MTJ stack, increasing, to a write voltage a bit line voltage of a bit line coupled to the target bit cell, the bit line selected from a plurality of bit lines, each bit line coupled to one or more of the plurality of bit cells at a first end of each spin hall metal electrode of the one or more of the plurality of bit cells; and reducing to ground a select line voltage of a select line coupled to the bit cell, the select line from a plurality of select lines having a high impedance condition, each select line coupled to one or more of the plurality of bit cells at a second, different, end of each spin hall metal electrode of the one or more of the plurality of bit cells.

In one embodiment, the method further involves further maintaining a plurality of word lines at high impedance, each word line coupled to one or more of the plurality of bit cells at the second electrode of each of the one or more of the plurality of bit cells.

In one embodiment, the spin hall metal electrode of each bit cell is disposed, with respect to an underlying substrate, above the MTJ stack.

In one embodiment, the spin hall metal electrode of each bit cell is disposed, with respect to an underlying substrate, above the MTJ stack.

In an embodiment, a method of writing a logic 0 to a bit cell in a cross-point array giant spin hall effect magnetoresistive random access memory (GSHE-MRAM) involves identifying a target bit cell in a plurality of bit cells, each bit cell having a spin hall metal electrode coupled with a magnetic tunnel junction (MTJ) stack, and a second electrode coupled with the MTJ stack. The method also involves decreasing, to a negative write voltage a bit line voltage of a bit line coupled to the target bit cell, the bit line selected from a plurality of bit lines, each bit line coupled to one or more of the plurality of bit cells at a first end of each spin hall metal electrode of the one or more of the plurality of bit cells. The method also involves reducing to ground a select line voltage of a select line coupled to the bit cell, the select line from a plurality of select lines having a high impedance condition, each select line coupled to one or more of the plurality of bit cells at a second, different, end of each spin hall metal electrode of the one or more of the plurality of bit cells.

In one embodiment, the method further involves maintaining a plurality of word lines at high impedance, each word line coupled to one or more of the plurality of bit cells at the second electrode of each of the one or more of the plurality of bit cells.

In one embodiment, the spin hall metal electrode of each bit cell is disposed, with respect to an underlying substrate, above the MTJ stack.

In one embodiment, the spin hall metal electrode of each bit cell is disposed, with respect to an underlying substrate, above the MTJ stack.

What is claimed is:

1. A cross-point array giant spin hall effect magnetoresistive random access memory (GSHE-MRAM), comprising:
a plurality of bit cells, each bit cell comprising a spin hall metal electrode coupled with a magnetic tunnel junction (MTJ) stack disposed above a substrate, and a second electrode disposed below and coupled with the MTJ stack, wherein the spin hall metal electrode of each bit cell comprises a metal selected from the group consisting of (β-Tantalum (β-Ta), β-Tungsten (β-W) and platinum (Pt), the metal disposed on a free magnetic layer of the MTJ stack of the bit cell, and wherein each bit cell does not include an associated select transistor;
a plurality of bit lines, each bit line coupled to one or more of the plurality of bit cells above and proximate a first end of each spin hall metal electrode of the one or more of the plurality of bit cells;
a unidirectional metal line disposed directly between the spin hall metal electrode of the one or more of the plurality of bit cells and one or more of the plurality of bit lines, wherein the unidirectional metal line is orthogonal to the one or more of the plurality of bit lines; and
a plurality of word lines, each word line below and coupled to one or more of the plurality of bit cells by the second electrode of each of the one or more of the plurality of bit cells.

2. The cross-point array GSHE-MRAM of claim 1, wherein the spin hall electrode comprises a second, different, metal on either side of the free magnetic layer.

3. The cross-point array GSHE-MRAM of claim 1, wherein the free magnetic layer is disposed on a dielectric layer of the MTJ stack of the bit cell, the dielectric layer is disposed on a fixed magnetic layer of the MTJ stack of the bit cell, and each bit cell further comprises:
an anti-ferromagnetic (AFM) layer disposed on the second electrode; and
a synthetic anti-ferromagnet (SAF) stack disposed on the AFM layer, wherein the MTJ stack is disposed on the SAF stack.

4. The cross-point array GSHE-MRAM of claim 3, wherein the free magnetic layer comprises CoFeB, the dielectric layer comprises magnesium oxide (MgO), the fixed magnetic layer comprises CoFeB, the SAF stack comprises a layer of ruthenium (Ru) disposed on a layer of CoFe, the AFM layer comprises IrMn, and the second electrode comprises a Ru/Ta/Ru stack.

5. A cross-point array giant spin hall effect magnetoresistive random access memory (GSHE-MRAM), comprising:
- a plurality of bit cells, each bit cell comprising a spin hall metal electrode coupled with a magnetic tunnel junction (MTJ) stack disposed above a substrate, and a second electrode disposed below and coupled with the MTJ stack, wherein the spin hall metal electrode is disposed on a free magnetic layer of the MTJ stack of the bit cell;
- a plurality of bit lines, each bit line coupled to one or more of the plurality of bit cells above and proximate a first end of each spin hall metal electrode of the one or more of the plurality of bit cells;
- a unidirectional metal line disposed directly between the spin hall metal electrode of the one or more of the plurality of bit cells and one or more of the plurality of bit lines, wherein the unidirectional metal line is orthogonal to the one or more of the plurality of bit lines; and
- a plurality of word lines, each word line below and coupled to one or more of the plurality of bit cells by the second electrode of each of the one or more of the plurality of bit cells.

6. The cross-point array GSHE-MRAM of claim 5, wherein the spin hall electrode comprises a second, different, metal on either side of the free magnetic layer.

7. The cross-point array GSHE-MRAM of claim 5, wherein the free magnetic layer is disposed on a dielectric layer of the MTJ stack of the bit cell, the dielectric layer is disposed on a fixed magnetic layer of the MTJ stack of the bit cell, and each bit cell further comprises:
- an anti-ferromagnetic (AFM) layer disposed on the second electrode; and
- a synthetic anti-ferromagnet (SAF) stack disposed on the AFM layer, wherein the MTJ stack is disposed on the SAF stack.

8. The cross-point array GSHE-MRAM of claim 7, wherein the free magnetic layer comprises CoFeB, the dielectric layer comprises magnesium oxide (MgO), the fixed magnetic layer comprises CoFeB, the SAF stack comprises a layer of ruthenium (Ru) disposed on a layer of CoFe, the AFM layer comprises IrMn, and the second electrode comprises a Ru/Ta/Ru stack.

* * * * *